United States Patent
Nomura et al.

(10) Patent No.: US 8,420,944 B2
(45) Date of Patent: Apr. 16, 2013

(54) CONNECTION STRUCTURE OF FLEXIBLE PRINTED CIRCUITS AND OPTICAL PICKUP DEVICE INCLUDING THE CONNECTION STRUCTURE

(75) Inventors: Rika Nomura, Yokohama (JP); Hiroaki Furuichi, Kawasaki (JP); Yoshio Oozeki, Yokohama (JP); Kazuhiko Ito, Yokohama (JP); Fumihito Ichikawa, Yokohama (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 432 days.

(21) Appl. No.: 12/420,966

(22) Filed: Apr. 9, 2009

(65) Prior Publication Data

US 2009/0323503 A1 Dec. 31, 2009

(30) Foreign Application Priority Data

Jun. 30, 2008 (JP) .................. 2008-169802

(51) Int. Cl.
*H05K 1/00* (2006.01)
(52) U.S. Cl.
USPC .......................................... 174/254; 361/749
(58) Field of Classification Search .................. 361/749, 361/777, 760, 771, 793; 174/254, 255, 256, 174/259; 257/782, 678
See application file for complete search history.

(56) References Cited

U.S. PATENT DOCUMENTS

| | | | | |
|---|---|---|---|---|
| 5,418,691 | A * | 5/1995 | Tokura ........................... | 361/803 |
| 7,974,104 | B2 * | 7/2011 | Kitada et al. .................. | 361/777 |
| 2006/0005215 | A1 * | 1/2006 | Wu ............................... | 720/652 |
| 2006/0117332 | A1 * | 6/2006 | Ochi et al. .................... | 720/659 |
| 2006/0161940 | A1 * | 7/2006 | Arai et al. ..................... | 720/685 |
| 2007/0169136 | A1 | 7/2007 | Hiramatsu et al. | |

FOREIGN PATENT DOCUMENTS

| | | |
|---|---|---|
| JP | 62-036569 | 3/1987 |
| JP | 2005-183647 | 7/2005 |
| JP | 2005-276263 | 10/2005 |
| JP | 2006-202367 | 8/2006 |
| JP | 2006-245514 | 9/2006 |
| JP | 2006-310449 | 11/2006 |
| JP | 2007-157295 | 6/2007 |

OTHER PUBLICATIONS

Japanese Office Action dated Nov. 1, 2011 for Application No. 2008-169802.

* cited by examiner

*Primary Examiner* — Yuriy Semenenko
(74) *Attorney, Agent, or Firm* — Antonelli, Terry, Stout & Kraus, LLP.

(57) ABSTRACT

A connection structure of Flexible printed circuits comprising: first and second Flexible printed circuits, respectively, including a base formed of a resin, a plurality of wiring patterns arranged side by side on the base, a cover film formed of a resin to cover opposite sides of the wiring patterns to the base, and a connection portion in which the plurality of wiring patterns are not covered by the cover film, the connection portions of the first and second Flexible printed circuits being connected with each other. The wiring patterns in the connection portions include a large width portion which is larger in width than the wiring patterns covered by the cover film. The large width portions on the first Flexible printed circuit and the large width portions on the second Flexible printed circuit are connected to each other by means of soldering.

12 Claims, 7 Drawing Sheets

CONNECTION STRUCTURE OF FLEXIBLE PRINTED CIRCUITS AND OPTICAL PICKUP DEVICE INCLUDING THE CONNECTION STRUCTURE

INCORPORATION BY REFERENCE

The present application claims priority from Japanese application JP2008-169802 filed on Jun. 30, 2008, the content of which is hereby incorporated by reference into this application.

BACKGROUND OF THE INVENTION

The present invention relates to an optical pickup device used for reproduction and recording from/into an optical disk such as CD (compact disk), DVD (digital versatile disk), etc., and a connection structure of flexible printed circuits used in optical pickup devices.

Figure 8:
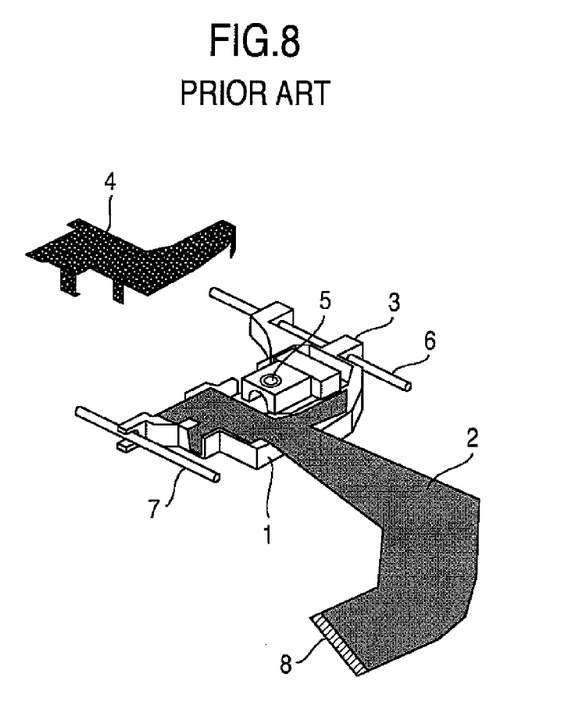
FIG. 8 is a perspective view showing a conventional example of a thin optical pickup case.

Conventionally, a thin optical pickup device (having a thickness of at most 7 mm) used for reproduction and recording from/into an optical disk such as CD, DVD, etc., or an optical disk drive device with a thin optical pickup device incorporated therein is structured as shown in FIG. 8. Parts, such as laser diode, various lenses, mirror, photodetector (not shown), etc., which constitute an optical system, are arranged on an optical pickup case 3 formed by means of die casting or molding, of which main components comprise metal such as Zn, Mg, Al, etc. and a PPS (poly phenylene sulfide) resin, and a Flexible printed circuit 2 is used as means that supplies an electric signal. Accompanying with thinning of optical disk drive device, connectors cannot be used due to height limitations. Therefore, the Flexible printed circuit 2 is structured into an integral form to extend to a portion 8 thereof, which is inserted into a connector of a drive side.

Figure 10:
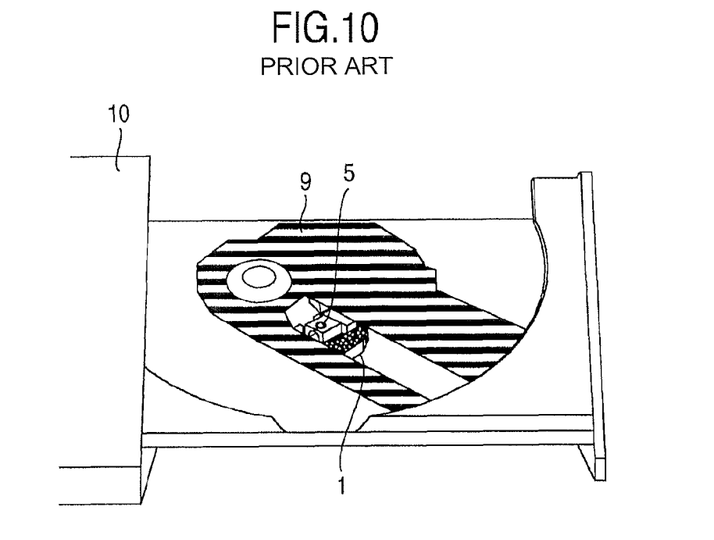
FIG. 10 is a perspective view showing a state, in which an optical pickup device is assembled into an optical disk drive device.

FIG. 10 shows a state, in which an optical pickup device is assembled into an optical disk drive device. An optical pickup device body 1 has an objective lens 5 facing upwardly and the lens 5 is opposed to an optical disk (not shown) through a notched portion of a drive cover 9. The optical pickup device performs information reading and writing while moving between an outer periphery and an inner periphery of the optical disk. All these parts are assembled into an optical disk drive device body 10 to provide a product.

In this manner, while a Flexible printed circuit used in a thin optical pickup is structured in an integral form, portions arranged on an inner side and an outer side of the flexible printed circuit are different from each other in performance required originally, and high density is emphasized on the inner side and flexibility is emphasized on the outer side. Hereupon, means of solution in the Flexible printed circuit 2 made into an integral form has been proposed to select a Flexible printed circuit, which has optimum performances for high density and flexibility, as a method that meets both performances required of a portion of the Flexible printed circuit to be fixed to an optical pickup device and a portion of the Flexible printed circuit to be inserted into the connector of the drive.

On the other hand, various parts cannot but be arranged at a high density in horizontal and vertical directions in a narrow optical pickup device, and therefore, a Flexible printed circuit serving as signal transmission is required to assume a complex configuration. This requires a divided structure for a Flexible printed circuit in terms of cost since necessary configurations obtained from a single original sheet cannot be increased in number and even a portion, for which a simple structure will do, is influenced by a portion, which takes longest time, because of different necessary processes according to portions.

Meantime, the optical pickup device shown in FIG. 8, or an optical disk drive device, into which a thin optical pickup device is assembled, is assembled through a plurality of complex processes. Therefore, there often arises a case in which the optical pickup device or the optical disk drive device is deemed as defective products due to dents, defects, etc. generated in the Flexible printed circuit during assembling process after a process, in which adjustment is accomplished on a laser diode, a photodetector, and various optical parts of the optical disk drive, is performed. In this respect, by adopting division of a Flexible printed circuit into a plural printed circuits and connection of Flexible printed circuits, an increase in yield of products and reduction in cost can be realized (see, for example, JP-A-2005-276263 and JP-A-2006-245514).

Because of a height limitation on an optical pickup, a connector proposed in JP-A-2006-310449 cannot be used for connection of two Flexible printed circuits, and so the printed circuits are connected to each other by means of soldering. In case of adopting division of a Flexible printed circuit and connection of Flexible printed circuits shown in FIG. 9A, when a conductor pattern of a first Flexible printed circuit and a conductor pattern of a second Flexible printed circuit are caused to face and overlap each other, the second Flexible printed circuit is made to define a back surface and a connector side contact 8 is reversed. Hereupon, as shown in FIG. 9B, the connector side contact 8 is directed upward by connecting the other end of the first Flexible printed circuit and the other end of the second Flexible printed circuit so as to have them facing and overlapping each other, and bending the connected ends of the Flexible printed circuits at 90° in a height direction (vertical direction) of the optical pickup device, or fixing the connected end of the first Flexible printed circuit and bending the connected end of the second Flexible printed circuit at 180°.

Figure 9A:
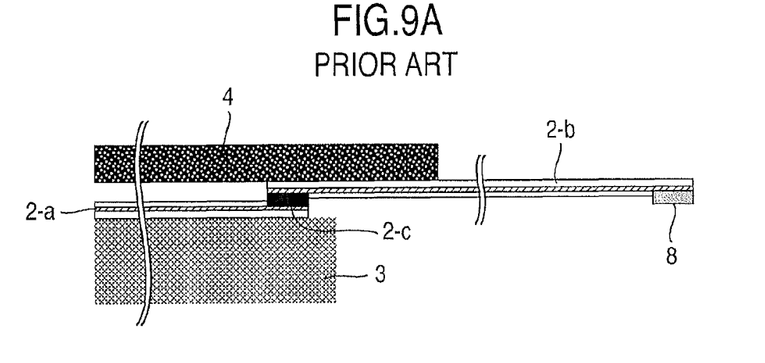
FIGS. 9A and 9B are perspective views showing connection portions to illustrate a method of connecting a first Flexible printed circuit and a second Flexible printed circuit.
Figure 9B:
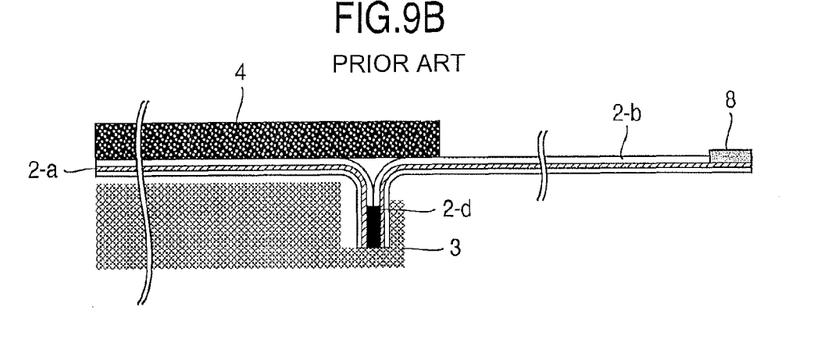

With the connected structure shown in FIG. 9B, however, stress is liable to be applied on the connection portions of the first and second Flexible printed circuits in a peel direction and a tendency of much decrease in joint strength is shown such that a connection portion 2-d in the connected structure shown in FIG. 9B has an average peel strength of at most 1.5 kgf as compared with an average shear strength of 3 kgf in a connection portion 2-c in the case where the Flexible printed circuits are caused to face and overlap each other as shown in FIG. 9A.

Further, many wires are arranged in a narrow location on a portion of the Flexible printed circuit, in which the Flexible printed circuit extends out of a cover element 4 from the optical pickup device and at which the Flexible printed circuit is dividable and the divided printed circuits are connectable with each other, and a grounding wire having a wide wiring width and signal wires having a narrow wiring width are mixed in the portion, but wires having a narrow wiring width tend to be one-sided. Therefore, wires having a narrow wiring width and a wiring pattern width of at most 100 µm are used as outermost wires in many cases, and in case where the division of the Flexible printed circuit and connection of Flexible printed circuits is employed, a structure of the connected portion becomes such that peeling is liable to occur from an end of the wires having a narrow wiring width, that is, the outermost wires.

Electro solder plating tends to disperse much in thickness depending upon a wiring width. In the case where wires having a narrow wiring width and wires having a large wiring width exist as is in a Flexible printed circuit to be used in an optical pickup device, the dispersion of the plating is much and wires having a narrow width tends to be small in thickness of the electro solder plating as compared with wires having a large width.

On the other hand, when soldering is used to connect Flexible printed circuits, in order to remove a Flexible printed circuit which is in bad order from connection portions of Flexible printed circuits and connect a fresh Flexible printed circuit to the connection portions, there is adopted a method of reheating and melting the solder connection portions to remove the Flexible printed circuit in bad order. In such method, molten solder is moved to the Flexible printed circuit in bad order. Accordingly, it is hard to ensure the quantity of solder required for connection to the Flexible printed circuit in good order and fixed to an optical pickup body and repair connection is difficult.

From the above, a structure readily enabling reinforcement of connection portions and repair connection is needed when a Flexible printed circuit is divided and the divided Flexible printed circuits are connected.

SUMMARY OF THE INVENTION

It is an object of the invention to provide a connection structure of Flexible printed circuits readily enabling reinforcement of connection portions and repair connection in the case where Flexible printed circuits are connected with each other.

A connection structure of Flexible printed circuits according to the inventions comprises first and second Flexible printed circuits, respectively, including a base formed of a resin, a plurality of wiring patterns arranged side by side on the base, a cover film formed of a resin to cover opposite sides of the wiring patterns to the base and a connection portion in which the plurality of wiring patterns are not covered by the cover film, the connection portions of the first and second Flexible printed circuits being connected with each other in an overlapping manner, wherein the wiring patterns in the connection portions include a large width portion which is larger in width than the wiring patterns covered by the cover film, and the large width portions on the first Flexible printed circuit and the large width portions on the second Flexible printed circuit are connected to each other by means of soldering.

As described above, when the structure of the invention is adopted, it is possible in the connection portions of the Flexible printed circuits in the optical pickup to increase outermost conductor patterns of the Flexible printed circuits in resistance to pulling and bending and to achieve an improvement in reliability and durability. Also, a further effect is produced to readily position a heating head from a back surface of a Flexible printed circuit at the time of connection.

Other objects, features and advantages of the invention will become apparent from the following description of the embodiments of the invention taken in conjunction with the accompanying drawings.

DESCRIPTION OF THE PREFERRED EMBODIMENT

An embodiment of the invention will be described below with reference to FIGS. 5 to 7. An optical pickup device 1 comprises various optical parts including an object lens 5, optical modules such as a laser diode and a photodetector, an optical pickup case 3 formed by means of die casting or molding, in which either of a PPS resin and metal such as Zn, Al, Mg, etc. constitutes a main component, a first Flexible printed circuit 2-*a* fixed to a body of the optical pickup device with chips mounted on the optical pickup case 3, a second Flexible printed circuit 2-*b* to be inserted into a connector on a drive side, and a cover element 4 that finally imposes a height limit. The Flexible printed circuits 2-*a*, 2-*b* generally comprise a resin including polyimide and an adhesive, and metal including a copper foil. The technology, according to the invention, of connection of Flexible printed circuits is generally applied to a thin optical pickup device but can also be applied to a product other than the thin optical pickup device, in which Flexible printed circuits are connected together.

First, in order to describe an embodiment of the invention, the mutual, positional relationships among respective parts in an optical pickup device will be described with reference to FIGS. 5 to 7. FIGS. 5, 6, and 7 are perspective views showing connection of a first Flexible printed circuit fixed to the optical pickup case and a second Flexible printed circuit to be inserted into a connector on a drive side.

Figure 5:
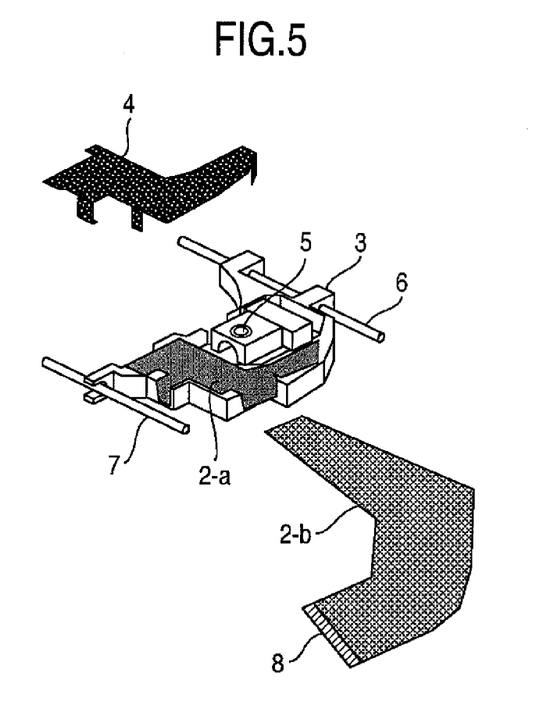
FIGS. 5 to 7 are perspective views respectively showing processes in which the first Flexible printed circuit and the second Flexible printed circuit are mounted an optical pickup case.

As shown in FIG. 5, the first flexible printed circuit 2-*a* is fixed to the optical pickup case 3 on a side of the object lens 5. Parts of the optical pickup case 3 engage with a main shaft 6 and a sub-shaft 7 and the optical pickup case 3 reciprocates in an axial direction of the shafts, that is, a travelling direction.

The first Flexible printed circuit 2-*a* fixed to the optical pickup case 3 is shown as being put in a state, in which testing is performed, that is, a state after the process of adjusting a laser diode, a photodetector, and various optical parts of the optical pickup device is performed. In the testing, a probe pin or a connector may be used. Even when a conventional, Flexible printed circuit 2 having a unified structure is a product found to be non-defective upon testing, it is made a defective product due to dents, defects, etc. of the Flexible printed circuit 2 generated in processes after testing.

Figure 6:
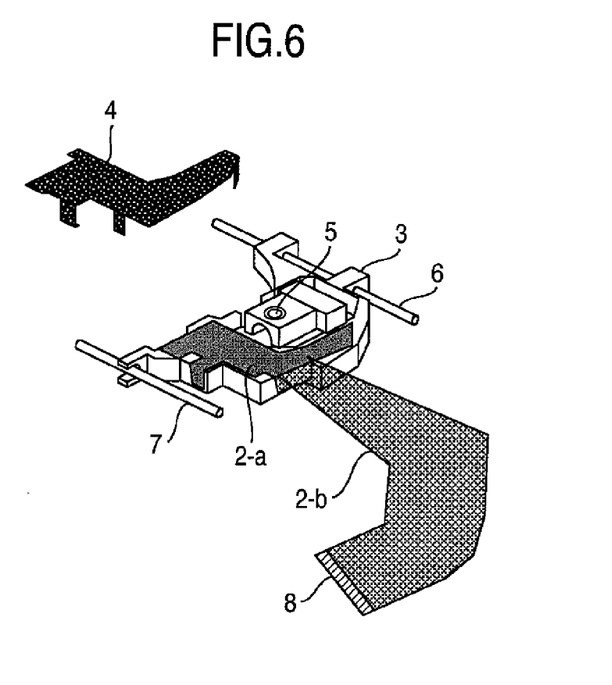

As shown in FIG. 6, the second Flexible printed circuit 2-*b* to be inserted into a connector on the drive side is positioned relative to the first Flexible printed circuit 2-*a* fixed to the optical pickup case 3 and thereafter a heating head (not shown) is used to pressurize and heat connection portions of the Flexible printed circuits 2-*a*, 2-*b* and they are connected with each other.

Figure 7:
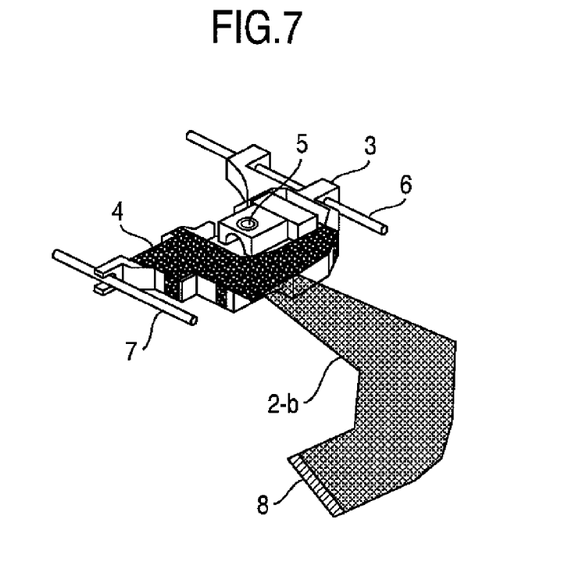

As shown in FIG. 7, a metallic cover element 4 is mounted to the optical pickup case 3 and on the Flexible printed circuits 2-*a*, 2-*b* shown in FIG. 6 and connected to each other so that they do not warp.

Figure 1:
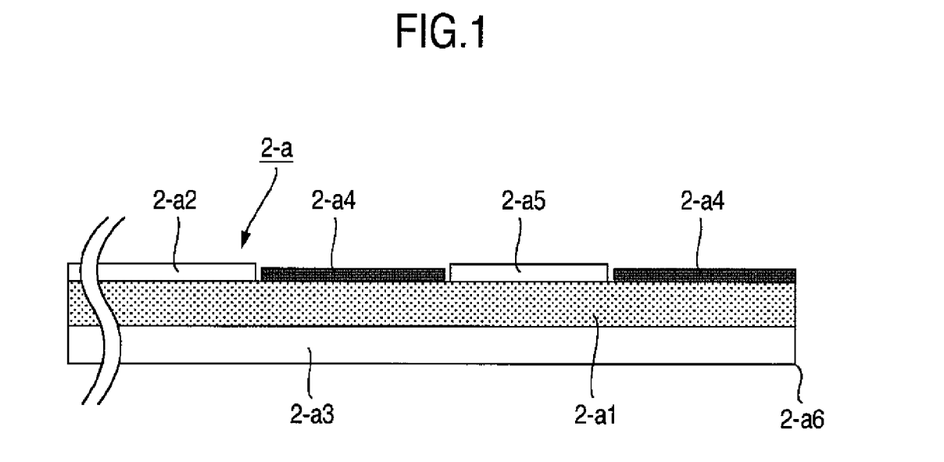
FIG. 1 is a cross sectional view of an end of a first Flexible printed circuit.

Subsequently, the embodiment of the invention will be described in detail with reference to cross sectional views and plan views, which are shown in FIGS. 1 to 4. FIG. 1 shows a state, in which the first Flexible printed circuit 2-*a* to be fixed to the optical pickup case 3 is mounted on a positioning jig (not shown). A horizontal direction traversing, from right to left, the first Flexible printed circuit 2-*a* of FIG. 1 corresponds to a vertical direction traversing, from top to bottom, wiring on the first Flexible printed circuit 2-*a* of FIG. 3A. The first Flexible printed circuit 2-*a* is structured such that a wiring copper foil 2-*a*1 is attached to a base film 2-*a*3 through an adhesive (not shown). Cover films 2-*a*2, 2-*a*5 are stuck to a surface of the wiring copper foil 2-*a*1 by an adhesive (not shown) in a manner to cover the same. Those portions of the wiring copper foil 2-*a*1, on which the cover films 2-*a*2, 2-*a*5 are absent, are used for mounting semiconductor chips and parts, or for connecting the second Flexible printed circuit 2-*b*. Solder plating 2-*a*4 is applied to the portions to facilitate connection to the chips and the parts and a mating printed circuit. A plating thickness is desirably 5 µm to 15 µm to form a solder fillet at the time of connection.

Figure 2:
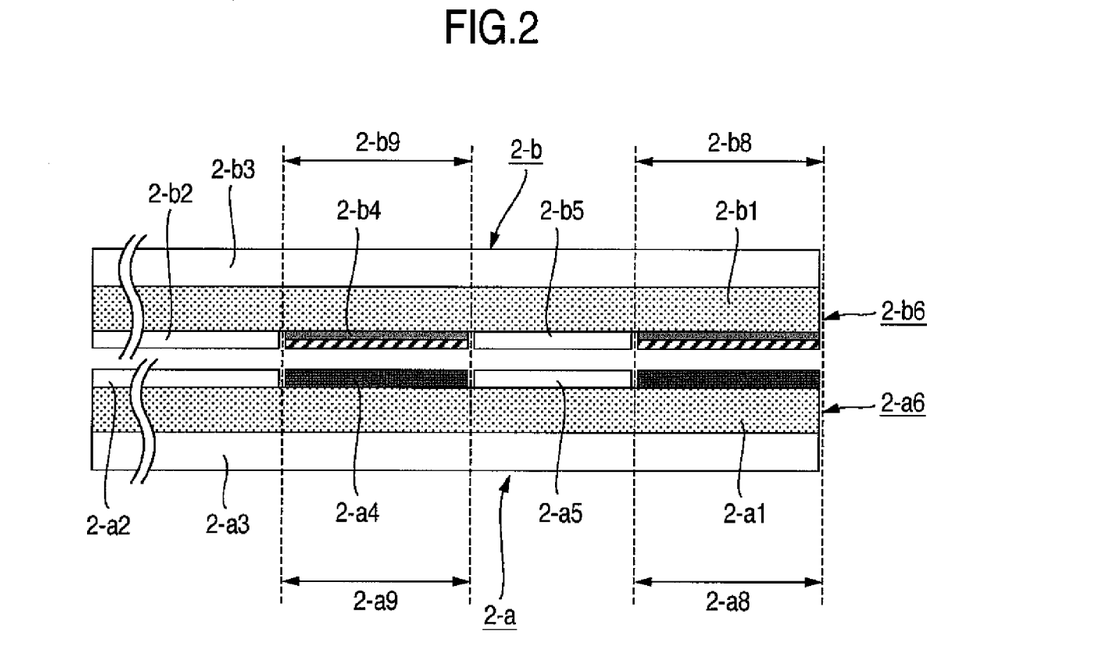
FIG. 2 is a cross sectional view showing a state, in which the first Flexible printed circuit and a second Flexible printed circuit are overlapped to each other.

FIG. 2 shows a state, in which an end 2-*b*6 of the second Flexible printed circuit 2-*b* to be inserted into a connector on a drive side is positioned, relative to an end 2-*a*6 of the first Flexible printed circuit 2-*a* to be fixed to the optical pickup case, and the first and second Flexible printed circuits are overlapped to each other. A horizontal direction traversing, from right to left, the first Flexible printed circuit 2-*a* of FIG. 2 corresponds to a vertical direction traversing, from top to bottom, the first Flexible printed circuit 2-*a* of FIG. 3A. In addition, a horizontal direction traversing, from right to left, the second Flexible printed circuit 2-b of FIG. 2 corresponds to a vertical direction traversing, from top to bottom, the second Flexible printed circuit 2-*b* of FIG. 3B. Like the first Flexible printed circuit 2-*a*, the second Flexible printed circuit 2-*b* is structured such that a wiring copper foil 2-*b*1 is attached to a base film 2-*b*3 through an adhesive (not shown). Cover films 2-*b*2, 2-*b*5 are stuck to a surface of the wiring copper foil 2-*b*1 by an adhesive (not shown) so as to cover the same. Those portions of the wiring copper foil 2-*b*1, on which the cover film 2-*b*2, 2-*b*5 are absent, are used for connection to the first Flexible printed circuit 2-*a*. Nickel plating and gold plating 2-*b*4 are applied to the portions of the wiring copper foil 2-*b*1 so as to facilitate connection to a mating Flexible printed circuit. According to performances required at the time of and after connection, solder plating and a combination of different kinds are selected for the gold plating 2-*b*4 to be applied to the surface.

Figures 3A, 3B:
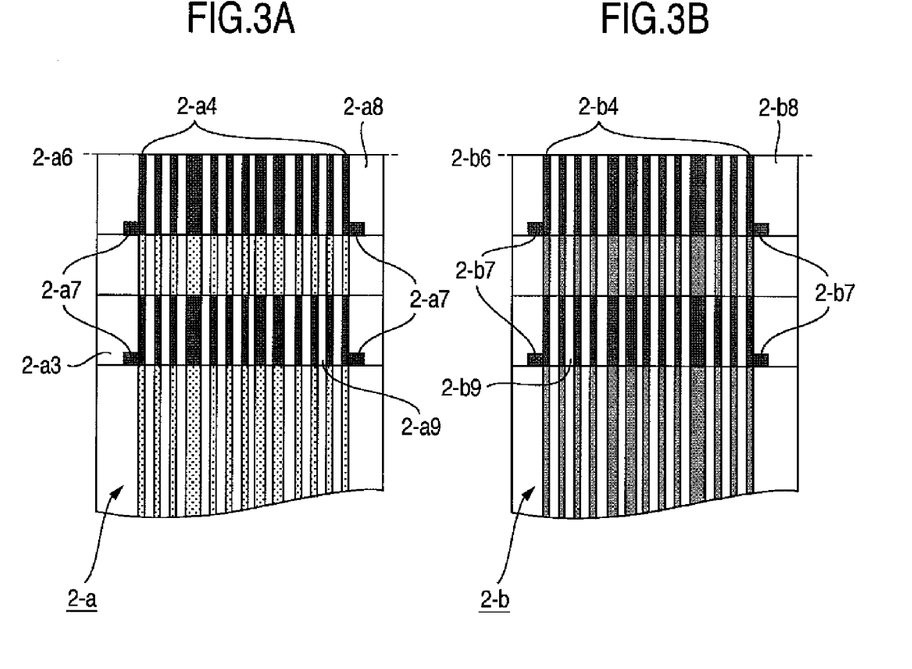
FIGS. 3A and 3B are plan views respectively showing connection portions of the first Flexible printed circuit and the second Flexible printed circuit.

Further, by providing the connection portions, which comprise connection portions 2-*a*8, 2-*b*8 and repair connection portions 2-*a*9, 2-*b*9, in a plurality of locations on the first and second Flexible printed circuits 2-*a*, 2-*b*, the connection portions 2-*a*8, 2-*b*8 are readily cut from and connection (repair connection) is performed by the use of the repair connection portions 2-*a*9, 2-*b*9 in the case where solder bridge, dents, defects, etc. are generated in a process of being assembled to the second Flexible printed circuit after connection of the connection portions 2-*a*8, 2-*b*8 and a defective product is resulted. A quantity of solder required for repair connection cannot be ensured on the connection portions 2-*a*8, 2-*b*8, which once connect the Flexible printed circuits 2-*a*, 2-*b* and are melted again and from which the second Flexible printed circuit is removed. The provision of the repair connection portions 2-*a*9, 2-*b*9, however, enables connection by means of removing an oxide film on a solder surface chemically and physically and by means of thermal crimping.

Also, the provision of the connection portions and the repair connection portions produces an effect that in positioning the Flexible printed circuits to each other, an increase in positional accuracy is achieved by using respective projections (which will be described hereinafter) of the connection portions and the repair connection portions as positioning marks to mate the same together.

Also, taking into consideration that the cover films generally get out of position by ±0.2 mm when the cover films are stuck together, and that the cover films will not peel off and get out of position from the Flexible printed circuits at the time of stamping of the Flexible printed circuits, it is desirable that the connection portions 2-*a*8, 2-*b*8 and the repair connection portions 2-*a*9, 2-*b*9 have a length of at least 1.0 mm.

Likewise, taking into consideration that the cover films get out of position when the cover films are stuck together, and the cover films will not peel off and get out of position from the Flexible printed circuits at the time of stamping of the Flexible printed circuits, it is desirable that the cover films 2-*a*5, 2-*b*5 bonded between the connection portions 2-*a*8, 2-*b*8 and the repair connection portions 2-*a*9, 2-*b*9 have a length of at least 1.0 mm.

FIGS. 3A and 3B are plan views showing connection portions of the first Flexible printed circuit 2-*a* which is to be fixed to the optical pickup case and the second Flexible printed circuit 2-*b* which is to be inserted into a connector on a drive side. The connection portion 2-*a*8 of the first Flexible printed circuit 2-*a* and the connection portion 2-*b*8 of the second Flexible printed circuit 2-*b* are connected so as to mate and overlap each other as shown in FIG. 9B. Projections 2-*a*7, 2-*b*7 protruding toward widthwise sides of the Flexible printed circuits are provided on outermost conductor patterns 2-*a*4, 2-*b*4 of the connection portions 2-*a*8, 2-*b*8 and the repair connection portions 2-*a*9, 2-*b*9 at positions remotest from the ends 2-*a*6, 2-*b*6 of the Flexible printed circuits.

When the connection portion 2-*a*8 of the first Flexible printed circuit and the connection portion 2-*b*8 of the second Flexible printed circuit are connected together, connection is accomplished as shown in FIG. 9B. When the second Flexible printed circuit 2-*b* is pulled, stress acts in a direction, in which the connection portions 2-*a*8, 2-*b*8 are peeled off. At this time, a largest stress acts on that side (a lower side in FIGS. 3A and 3B) of the connection portions in a length direction of wiring on the Flexible printed circuits, a large stress is liable to act widthwise on an either outermost wiring on the left and the right of the Flexible printed circuits, and generation of peeling is liable to begin on that portions, on which stress is applied. Also, when peeling begins and solder cracks, the crack enlarges to make peeling liable to proceed. That is, a large stress acts on those portions, on which the projections 2-*a*7, 2-*b*7 are provided, and from which peeling is liable to occur. The invention provides the projections 2-a7, 2-b7 on those portions of the connection portions, on which stress is most liable to be applied, and wide portions having a large wiring width, so that it is possible to increase an area where solder connects, thus enabling an improvement in resistant strength against peeling. Also, since the projections 2-a7, 2-b7 are formed integral with the wiring patterns, the projections 2-a7, 2-b7 are also inhibited from peeling off the base films 2-a3, 2-b3 due to a peel stress. Since the projections 2-a7, 2-b7 are provided to protrude outward in a width direction from the outermost wiring patterns, the projections inhibit the outermost wirings from interfering with other wiring patterns.

Figure 4:
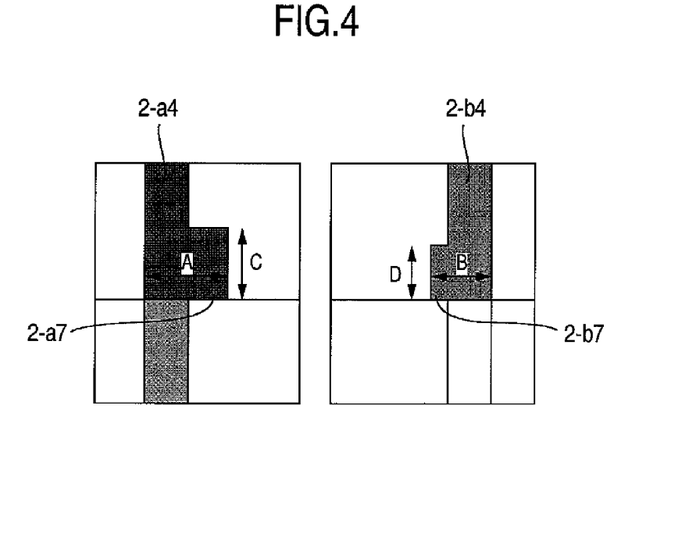
FIG. 4 is enlarged plan views of projections provided on the outermost conductor patterns of the connection portions of the first and second Flexible printed circuits.

FIG. 4 is an enlarged plan view showing the projections 2-a7, 2-b7.

The solder plating (2-a4 in FIG. 1) is formed on the connection portion 2-a8 of the first Flexible printed circuit 2a and the gold plating (2-b4 in FIG. 2) is formed on the connection portion 2-b8 of the second Flexible printed circuits 2-b and the relationship between a projection width A of the projection 2-a7 and a projection width B of the projection 2-b7 is desirably A>B in order to form fillets on the connection portions to achieve an improvement in strength.

While signal wires, etc. having a narrow wiring width tend to be one-sided and have a wiring pattern width of at most 100 μm, the widths A, B of the projections 2-a7, 2-b7 of the first and second Flexible printed circuits 2-a, 2-b are desirably A, B>100 μm in order to increase the connection portions in mechanical strength.

In the case where the relationship between widths of the projections 2-a7, 2-b7 of the first and second Flexible printed circuits 2-a, 2-b is A≦B, the relationship between lengths C, D of the projections is C>D and D>100 μm is desirable.

In the case where the connection portions 2-a7, 2-b7 are not provided on the outermost conductor patterns of the connection portions of the first and second Flexible printed circuits, the same effect as described above is produced since fillets are readily formed when the connection portion conductor pattern (solder plating side) of the first Flexible printed circuit is thicker than the connection portion conductor pattern (gold plating side) of the second Flexible printed circuit.

In the case where the projections 2-a7, 2-b7 on the outermost conductor patterns of the connection portions of the first Flexible printed circuit and the second Flexible printed circuit are worked to form through-holes thereon, the same effect as described above is produced when the conductor pattern 2-a4 (solder plating side) of the connection portion of the first Flexible printed circuit is larger than the conductor pattern 2-b4 (gold plating side) of the connection portion of the second Flexible printed circuit.

As described above, when the structure of the invention is adopted, fillets are formed on outermost conductor patterns at the connection portions when the Flexible printed circuits are connected together in the optical pickup whereby it is possible to make resistance to pulling and bending and to achieve an improvement in reliability and durability.

There is caused a problem that since a heating head is positioned from a back surface of a Flexible printed circuit when the second Flexible printed circuit 2-b is positioned relative to the first Flexible printed circuit 2-a to be melted, it is difficult to determine a boundary between a conductor pattern and the cover film, and it is hard to position the heating head. However, the projections 2-a7, 2-b7 are provided on the outermost conductor patterns of the Flexible printed circuits and therefore positioning of the heating head is made easy.

Figure 11A:
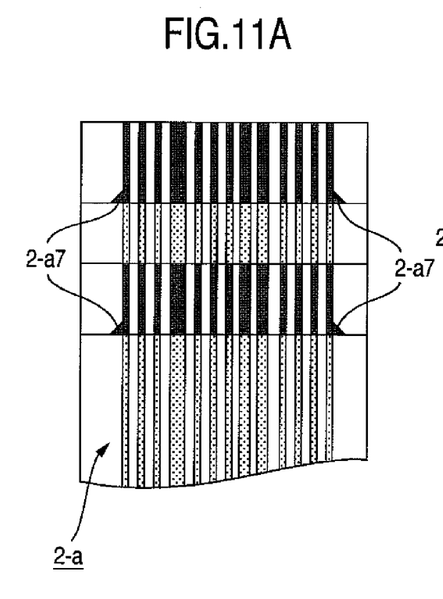
FIGS. 11A and 11B are plan views showing connection portions of a first and a second Flexible printed circuit which are different from those in the embodiment shown in FIG. 3.
Figure 11B:
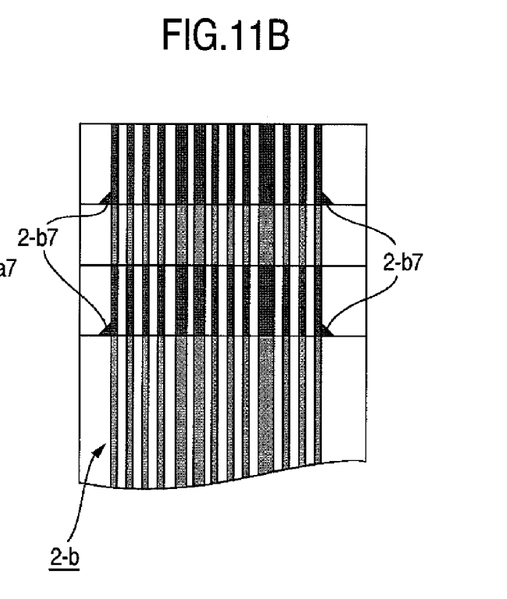

FIGS. 11A and 11B show modification of the projections. The projections are triangular in shape and sides being largest in projection width define ends of the connection portions.

Figure 12A:
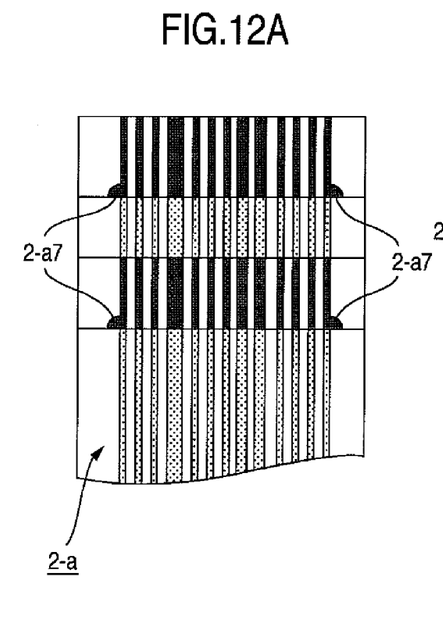
FIGS. 12A and 12B are plan views showing connection portions of a first and a second Flexible printed circuit which are different from those in the embodiment shown in FIG. 3.
Figure 12B:
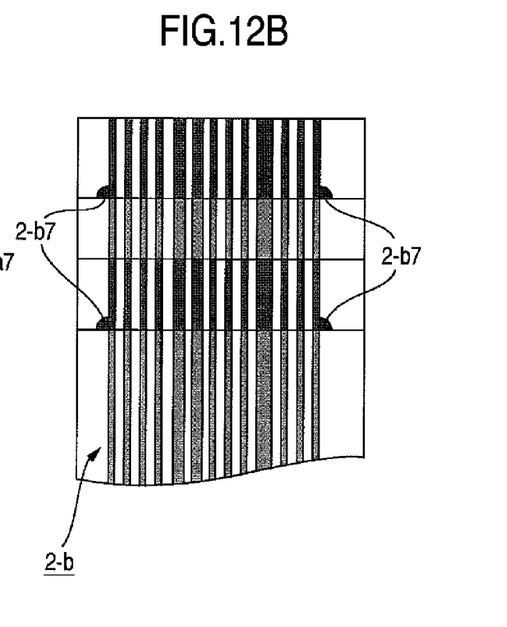

FIGS. 12A and 12B show another modification of the projections. The projections are sector-shaped and sides being largest in projection width define ends of the connection portions.

Figure 13A:
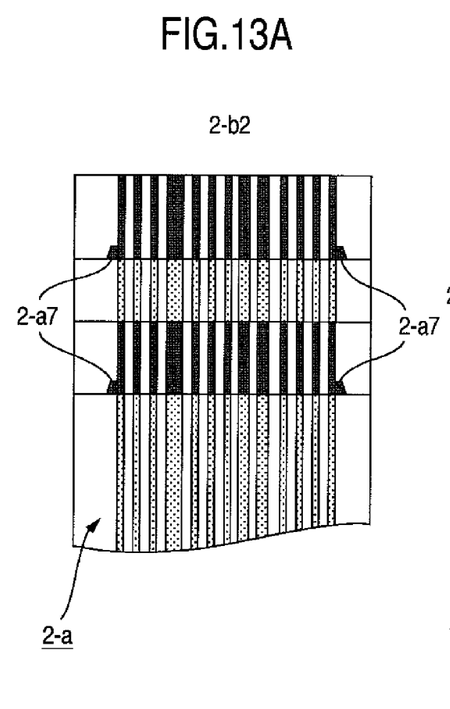
FIGS. 13A and 13B are plan views showing connection portions of a first and a second Flexible printed circuit which are different from those in the embodiment shown in FIG. 3.
Figure 13B:
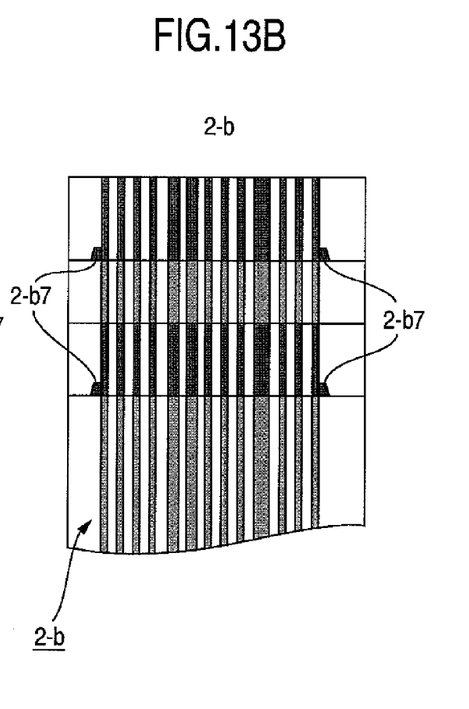

FIGS. 13A and 13B show other modification of the projections. The projections are trapezoidal-shape and sides being largest in projection width define ends of the connection portions.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A connection structure of flexible printed circuits comprising:
   a first flexible printed circuit and a second flexible printed circuit, each respectively including:
   a resin base,
   a plurality of wiring patterns arranged side by side on the resin base, so as to include inner wiring patterns and outermost wiring patterns,
   a resin cover film disposed to cover portions of the wiring patterns opposite to the resin base, and
   a plurality of connection portions, where the plurality of wiring patterns are not covered by the resin cover film;
   wherein connection portions of the first flexible printed circuit are connected to connection portions of the second flexible printed circuit;
   wherein in the connection portions, each of the outermost wiring patterns includes a large width portion wider than both inner wiring patterns in the connection portions and wiring patterns covered by the resin cover film;
   wherein large width portions on the first flexible printed circuit are connected to large width portions on the second flexible printed circuit by means of soldering;
   wherein said first and second flexible printed circuits each include an equipment connection portion, disposed in the same lengthwise direction of said wiring patterns relative to said connection portions;
   wherein said large width portions on the first and second flexible printed circuits are located in connection portions closest to said equipment connection portions;
   wherein large width portions on one of said first and second flexible printed circuits are narrower than large width portions on the other of said first and second flexible printed circuits, but wider than both inner wiring patterns in the connection portions and wiring patterns covered by the resin cover film;
   wherein inner wiring patterns and portions of the outermost wiring patterns other than large width portions in the connection portions have the same widths as wiring patterns covered by the resin cover films; and
   wherein each large width portion only protrudes outwardly from a wire in a wiring pattern, but only in the widthwise direction of the flexible printed circuits.

2. The connection structure of flexible printed circuits according to claim 1, wherein the connection portion of the second flexible printed circuit is provided on a side of the cover film in a thickness direction of the second flexible printed circuit.

3. The connection structure of flexible printed circuits according to claim 1, wherein a solder plating is formed on a large width portion of the first flexible printed circuit, and
a width of a large width portion of the first flexible printed circuit is larger than a width of a large width portion of the second flexible printed circuit.

4. The connection structure of flexible printed circuits according to claim 1, wherein a width of a large width portion of the first flexible printed circuit and a width of a large width portion of the second flexible printed circuit amount to at least 100μm.

5. The connection structure of flexible printed circuits according to claim 1, wherein a length of a large width portion of the first flexible printed circuit is larger than a length of a large width portion of the second flexible printed circuit.

6. The connection structure of flexible printed circuits according to claim 1, wherein a length of a large width portion of the first flexible printed circuit and a length of a large width portion of the second flexible printed circuit amount to at least 100μm.

7. The connection structure of flexible printed circuits according to claim 1, further comprising a repair connection portion, where the wiring patterns are not covered by the cover film, and which includes a large width portion wider than the wiring patterns covered by the cover film.

8. An optical pickup device comprising:
the connection structure of flexible printed circuits according to claim 1; an optical pickup case; a lens; a mirror; a laser diode; and a photodetector, and
wherein the first flexible printed circuit is arranged on the optical pickup case.

9. An optical pickup device comprising: the connection structure of flexible printed circuits according to claim 2; an optical pickup case; an optical pickup cover provided on the optical pickup case; a lens; a mirror; a laser diode; and a photodetector, and
wherein the first flexible printed circuit is provided between the optical pickup case and the optical pickup cover, with a cover film of the first flexible printed circuit directed toward the optical pickup cover, and
the second flexible printed circuit is arranged with a cover film of the second flexible printed circuit directed toward the optical pickup cover.

10. The connection structure of flexible printed circuits according to claim 1, wherein large width portions are wider than inner writing patterns, and inner wiring patterns and outermost wiring patterns are arranged side by side on the connection portions of the first and second flexible printed circuits.

11. A connection structure of flexible printed circuits comprising:
a first flexible printed circuit and a second flexible printed circuit, each respectively including:
a resin base,
a plurality of wiring patterns arranged side by side on the resin base, so
as to include inner wiring patterns and outermost wiring patterns,
a resin cover film disposed to cover portions of the wiring patterns opposite to the resin base, and
a plurality of connection portions, where the plurality of wiring patterns are not covered by the resin cover film;
wherein connection portions of the first flexible printed circuit are connected to connection portions of the second flexible printed circuit;
wherein in the connection portions, each of outermost wiring patterns includes a large width portion, the large width portion being wider than inner wiring patterns covered by the resin cover film;
wherein in the connection portions, large width portions on the first flexible printed circuit are connected to large width portions on the second flexible printed circuit by means of soldering, and portions other than large width portions on the first flexible printed circuit are connected to portions other than large width portions on the second flexible printed circuit by means of soldering;
wherein said first and second flexible printed circuits each include an equipment connection portion, disposed in the same lengthwise direction of said wiring patterns relative to said connection portions;
wherein said large width portions on the first and second flexible printed circuits are located in connection portions closest to said equipment connection portions;
wherein large width portions on one of said first and second flexible printed circuits are narrower than large width portions on the other of said first and second flexible printed circuits, but wider than both inner wiring patterns in the connection portions and wiring patterns covered by the resin cover film;
wherein inner wiring patterns and portions of the outermost wiring patterns other than large width portions in the connection portions have the same widths as wiring patterns covered by the resin cover films; and
wherein each large width portion only protrudes outwardly from a wire in a wiring pattern, but only in the widthwise direction of the flexible printed circuits.

12. A connection structure of flexible printed circuits comprising:
a first flexible printed circuit and a second flexible printed circuit, each respectively including:
a resin base,
a plurality of wiring patterns arranged side by side on the resin base, so as to include inner wiring patterns and outermost wiring patterns,
a resin cover film disposed to cover portions of the wiring patterns opposite to the resin base, and
a plurality of connection portions, disposed where the outermost wiring patterns of the plurality of wiring patterns are not covered by the resin cover film;
wherein connection portions of the first flexible printed circuit are connected to connection portions of the second flexible printed circuit;
wherein the first and second flexible printed circuits have the same width in their respective connection portions;
wherein large width portions on the first flexible printed circuit are connected to large width portions on the second flexible printed circuit by means of soldering;
wherein said first and second flexible printed circuits each include an equipment connection portion, disposed in the same lengthwise direction of said wiring patterns relative to said connection portions;
wherein said large width portions on the first and second flexible printed circuits are located in connection portions closest to said equipment connection portions;
wherein large width portions on one of said first and second flexible printed circuits are narrower than large width portions on the other of said first and second flexible printed circuits, but wider than both inner wiring patterns in the connection portions and wiring patterns covered by the resin cover film;
wherein inner wiring patterns and portions of the outermost wiring patterns other than large width portions in the connection portions have the same widths as wiring patterns covered by the resin cover films; and wherein each large width portion only protrudes outwardly from a wire in a wiring pattern, but only in the widthwise direction of the flexible printed circuits.

* * * * *